:::

United States Patent
Park et al.

(12) United States Patent
(10) Patent No.: US 7,609,504 B2
(45) Date of Patent: Oct. 27, 2009

(54) HIGH-DIELECTRIC CONSTANT METAL-CERAMIC-POLYMER COMPOSITE MATERIAL AND METHOD FOR PRODUCING EMBEDDED CAPACITOR USING THE SAME

(75) Inventors: Eun Tae Park, Kyungki-do (KR); Jeong Joo Kim, Daegu (KR); Hee Young Lee, Daegu (KR); Eun Sub Lim, Kyungsangnam-do (KR); Jong Chul Lee, Kyungsangbook-do (KR); Yul Kyo Chung, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 389 days.

(21) Appl. No.: 11/358,087

(22) Filed: Feb. 22, 2006

(65) Prior Publication Data
US 2006/0223931 A1    Oct. 5, 2006

(30) Foreign Application Priority Data
Apr. 1, 2005    (KR) .................... 10-2005-0027765

(51) Int. Cl.
    *H01G 4/06*    (2006.01)
(52) U.S. Cl. .............. 361/321.4; 361/321.1; 361/321.2; 361/321.5; 361/301.02; 361/312
(58) Field of Classification Search .............. 361/321.4, 361/321.5, 311–313, 301.1, 301.2, 302–305, 361/306.1, 306.3, 321.1
    See application file for complete search history.

(56) References Cited

U.S. PATENT DOCUMENTS

| | | | | |
|---|---|---|---|---|
| 5,805,409 A | * | 9/1998 | Takahara et al. | ............. 361/303 |
| 6,048,379 A | * | 4/2000 | Bray et al. | ..................... 75/229 |
| 6,187,427 B1 | * | 2/2001 | Taylor-Smith et al. | ... 428/305.5 |
| 6,370,013 B1 | * | 4/2002 | Iino et al. | ................. 361/306.3 |
| 6,525,921 B1 | * | 2/2003 | Nakatani et al. | ......... 361/306.3 |
| 6,544,651 B2 | * | 4/2003 | Wong et al. | .................. 428/413 |
| 6,579,623 B2 | * | 6/2003 | Kurihara et al. | ............. 428/556 |
| 6,924,971 B2 | * | 8/2005 | Satsu et al. | ................. 361/311 |

(Continued)

FOREIGN PATENT DOCUMENTS

JP    01-156407    6/1989

(Continued)

OTHER PUBLICATIONS

Japanese Office Action, with English translation, issued in Japanese Patent Application No. JP 2006-041572, mailed Nov. 4, 2008.

*Primary Examiner*—Nguyen T Ha
(74) *Attorney, Agent, or Firm*—McDermott Will & Emery LLP (57) ABSTRACT

The invention relates to a high-dielectric constant metal/ceramic/polymer composite material and a method for producing an embedded capacitor.

As ceramic particles having a relatively small size are bound to the surface of metal particles having a relatively large size by mixing, the occurrence of percolation can be prevented without coating the metal particles, and at the same time, the capacitance of an embedded capacitor can be increased. In addition, a process for coating the surface of the metal particles can be omitted, thus contributing to the simplification of the overall preparation procedure.

26 Claims, 4 Drawing Sheets

○ Metal Powder o Insulating Powder

U.S. PATENT DOCUMENTS

| | | | |
|---|---|---|---|
| 6,987,661 B1 * | 1/2006 | Huemoeller et al. | ........ 361/312 |
| 2002/0039667 A1 | 4/2002 | Takaya et al. | |

FOREIGN PATENT DOCUMENTS

| JP | 09-087701 | 3/1997 |
|---|---|---|
| JP | 10-055930 | 2/1998 |
| JP | 2001-68803 | 3/2001 |
| JP | 2001-313208 | 11/2001 |
| JP | 2004-221603 | 8/2004 |
| JP | 2004-281169 | 10/2004 |

* cited by examiner

HIGH-DIELECTRIC CONSTANT METAL-CERAMIC-POLYMER COMPOSITE MATERIAL AND METHOD FOR PRODUCING EMBEDDED CAPACITOR USING THE SAME

RELATED APPLICATIONS

The present application is based on, and claims priority from, Korean Application Number 2005-27765, filed 01, Apr. 2005 the disclosure of which is incorporated by reference herein in its entirety.

BACKGROUND OF THE INVENTION

1. Field of the Invention

The present invention relates to a high-dielectric constant metal/ceramic/polymer composite material and a method for producing an embedded capacitor. More specifically, the present invention relates to an embedded capacitor with a high dielectric constant in which ceramic insulating particles and metal particles are simultaneously mixed with a polymer resin so that the ceramic particles are bound to the metal particles.

2. Description of the Related Art

With recent advances in the miniaturization and high-frequency characteristics of multilayer substrates, passive devices mounted on conventional PCB substrates have been obstacles in the miniaturization. Particularly, due to a rapidly increasing tendency toward embedding and an increase in the number of I/O terminals in semiconductors, it is difficult to ensure spaces sufficient to accommodate a number of passive devices around active integrated circuit chips. The driving frequency of semiconductors is increased, which requires the use of decoupling capacitors for stably supplying an electric power supply from input terminals. When such decoupling capacitors are at a close distance from input terminals, inductance arising from high frequency can be reduced. To meet the demand for miniaturization and high-frequency characteristics, some solutions have been proposed to overcome the limitation associated with the arrangement of capacitors around active integrated circuit chips. For example, methods have been proposed to embed chips under active integrated circuit chips of substrates and to reduce the inductance of chips. Various approaches to the proposals have been attempted, e.g., development of low ESL MLCCs.

Conventional high-dielectric constant materials for embedded capacitors are materials in which a ferroelectric powder, which is known to have a high dielectric constant, is dispersed in an epoxy resin. However, since the epoxy resin, acting as a matrix, has a low dielectric constant, capacitors are formed in serial connection despite an increase in the dielectric constant of the powder. Accordingly, the overall dielectric constant of the materials is greatly dependent on the low dielectric constant of the epoxy resin. No particular methods have been suggested to increase the dielectric constant of materials, other than increasing the volume ratio of powder to resins. However, since the volume fraction of powder is limited to a specific level in PCB lamination processes, there is a difficulty in increasing the volume fraction of powder. If the volume fraction of powder is increased, the processing characteristics are inevitably deteriorated. Accordingly, the dielectric constant is substantially unchanged within the volume fraction range applicable to the processes.

In an attempt to overcome these problems, a method for increasing the dielectric constant of a composite material is suggested in Japanese Patent Application No. 2001-68803. According to this method, a material having a relatively high conductivity is added to allow a filler to serve as a conductor, not as a dielectric material, instead of adding a high-dielectric constant material to increase the overall dielectric constant of a composite material.

However, conductive fillers, such as metals, tend to agglomerate, and thus it is difficult to uniformly disperse the fillers in resins. In addition, when a conductive filler having a very high conductivity is added in a powder form, dielectric breakdown may readily occur. Accordingly, when a conductive material is added in a specific volume fraction, percolation, which is a term used in the mixing rule, occurs, and as a result, the conductive material is not used as a dielectric film but as a conductor film. Further, an increase in dielectric loss is induced by an eddy current generating within conductive materials according to the changes in frequency. That is, in the case where a general ferroelectric filler, $BaTiO_3$, is used, the dielectric constant sharply increases in a specific volume ratio. Accordingly, effective control of increased conductivity arising from the addition of metal powder and an increase in the volume fraction of metals to the most extent may be a method for increasing the dielectric constant of composite materials. It is important to create a situation that can prevent the occurrence of percolation despite the addition of a large amount of metal powder.

To this end, U.S. Patent Publication No. 2002-0039667 discloses a method for coating the surface of a metal powder with an insulating dielectric layer. The advantages of this method are that the occurrence of percolation between metal particles is inhibited and the dielectric constant of the dielectric layer is increased.

According to the method, however, space charges are decreased due to coating with the insulating layer, and hence the content of a filler to be percolated is increased. That is, since the filler must be present in an amount of 30% by volume or more to achieve a high dielectric constant, the processability is deteriorated. In addition, since additional processing, such as annealing, must be performed, the procedure is complicated, uniform coating is difficult and sufficient reproducibility cannot be ensured.

SUMMARY OF THE INVENTION

It is one object of the present invention to provide a composite dielectric material that can be prepared in a simple manner despite high dielectric constant and can inhibit the occurrence of percolation despite high metal content.

It is another object of the present invention to provide a multilayer printed circuit board using the composite dielectric material.

It is another object of the present invention to provide a module substrate using the composite dielectric material.

It is yet another object of the present invention to provide a method for preparing the composite dielectric material.

In accordance with a first aspect of the present invention, there is provided a composite dielectric material composition comprising ceramic particles, metal particles and a resin wherein the ceramic particles and the metal particles are dispersed in the resin so that the ceramic particles surround the metal particles.

In accordance with a second aspect of the present invention, there is provided a printed circuit board produced using the composite dielectric material composition.

In accordance with a third aspect of the present invention, there is provided a module substrate comprising a printed circuit board produced using the composite dielectric material.

In accordance with a fourth aspect of the present invention, there is provided a method for preparing the composite dielectric material.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

The present invention will now be described in more detail.

The present invention provides a composite dielectric material composition comprising ceramic particles, metal particles and a resin wherein a mixture of the ceramic particles and the metal particles is dispersed in the resin so that the metal particles are surrounded with the ceramic particles, thereby preventing deterioration of processability and enabling the production of an embedded capacitor with a high dielectric constant. According to the composite dielectric material of the present invention, the use of a combination of a ceramic powder and a metal improves the dielectric constant and decreases the amount of the ceramic powder used, achieving an improvement in processability.

The metal used in the present invention is not particularly limited, and examples thereof include Cu, Ni, Ag, Al, Zn, Co, Fe, Cr, and Mn.

It is preferred that the metal particles used in the present invention have an average diameter of 0.1-7.5 μm. When the average diameter of the metal particles is below 0.1 μm, the dispersibility of the metal particles is worsened and the coatability of the ceramic particles on the metal particles is poor. Meanwhile, when the average diameter of the metal particles is above 75 μm, the dielectric loss is unfavorably increased. Accordingly, the metal particles preferably have a particle diameter within the above range. It is more preferable that the metal particles have a particle diameter of 1-50 μm, and particularly 2-25 μm.

The metal particles may be spherical. More preferably, the metal particles have a rough surface. The use of metal particles whose surface is rough facilitates the binding of the ceramic powder to the surface of the metal particles.

The metal particles whose surface is rough preferably have a surface roughness of 0.01 to 0.5 microns, and more preferably 0.05 to 0.3 microns. When the metal particles whose surface is rough have a surface roughness of less than 0.01 microns, there is no large difference in effects when compared to the use of spherical metal particles. Meanwhile, when the metal particles whose surface is rough have a surface roughness of more than 0.5 microns, the rough surface of the metal particles is undesirably flattened during ball milling within the polymer resin. Accordingly, it is preferred that the metal particles have a surface roughness within the above range.

The metal particles can be used in an amount of 1-30% by volume with respect to the total volume of the composite dielectric material composition. When the metal particles are used in an amount of less than 1% by volume, the dielectric constant is lowered. Meanwhile, when the metal particles are used in an amount exceeding 30% by volume, the volume fraction of the ceramic particles must be increased, as explained below, and thus the content of the resin is relatively low. This low resin content causes delamination of a dielectric layer from a metal foil, e.g., copper foil. If the volume fraction of the ceramic particles is decreased in order to maintain the volume fraction of the resin, contact between the metal particles takes place, unfavorably leading to the occurrence of percolation. Accordingly, the content of the metal particles is preferably limited to the above range, and more preferably 10-30% by volume.

The ceramic particles are not particularly limited, and examples thereof include particles of ferroelectric materials having the chemical formula $ABO_3$, such as $BaTiO_3$, $PbTiO_3$, $CaTiO_3$, $SrTiO_3$, PMN, PMN-PT, PZT, PZN-PT and PMT-PT. These ferroelectric materials may be used in the form of mixtures.

The ceramic particles used in the present invention may be insulating particles commonly used in the art to which the present invention pertains. Preferred are ferroelectric insulating particles and insulating particles having a perovskite structure. The ceramic powder having a perovskite structure can be obtained by hydrothermal, hydrolysis, solid-state, hydroxide, citric acid and vapor-phase processes commonly employed in the art to which the present invention pertains.

The ceramic particles have an average diameter below 50% of that of the metal particles. If the diameter of the ceramic particles is outside the above limitation, they do not readily surround the metal particles and thus contact between the metal particles takes place to induce percolation, undesirably causing short-circuiting.

The ceramic particles are added in an amount of 1-40% by volume, based on the total volume of the composite dielectric material composition. When the ceramic particles are added in an amount of less than 1% by volume, the capacitance is undesirably lowered. Meanwhile, when the ceramic particles are added in an amount exceeding 50% by volume, the amount of the epoxy resin is relatively small and thus the adhesion of the ceramic particles to the metal foil is poor. Accordingly, the ceramic particles are preferably present in the range defined above, and preferably in the range of 20-40% by volume.

The ceramic particles used in the present invention may be doped with an additive for the purpose increasing the dielectric constant. As the additive, there can be used an oxide (2+, 3+ or 5+) of Mn, Mg, Sr, Ca, Y, Nb or the like, or an oxide of a lanthanide element, such as Ce, Dy, Ho, Yb, Nd or the like. These oxides may be used alone or in combination thereof.

The additive may be added in an amount of 0.01-5 mol % and preferably 1-2 mol % per mole of the ferroelectric material. When the additive is added in an amount of less than 0.01 mol %, improvement in dielectric constant is negligible. Meanwhile, when the additive is added in an amount exceeding 5 mol %, the dielectric constant is undesirably lowered.

The ferroelectric material into which the additive is introduced may be annealed in an oxidizing, reducing or vacuum atmosphere at 800-1,300° C., preferably 1,000-1,300° C. for 0.5-2 hours. The annealing in an oxidizing, reducing or vacuum atmosphere can be performed in accordance with the procedure commonly employed in the art to which the present invention belongs. When the annealing is performed at a temperature lower than 800° C. or for a time of less than 30 minutes, the additive is not sufficiently bound to the ceramic particles and thus an increase in dielectric constant is insignificant. Meanwhile, when the annealing is performed at a temperature higher than 1,300° C. or for a time more than 2 hours, the grains are grown and the thickness of the insulating layer is increased, which undesirably leads to a reduction in dielectric constant.

Figure 1:
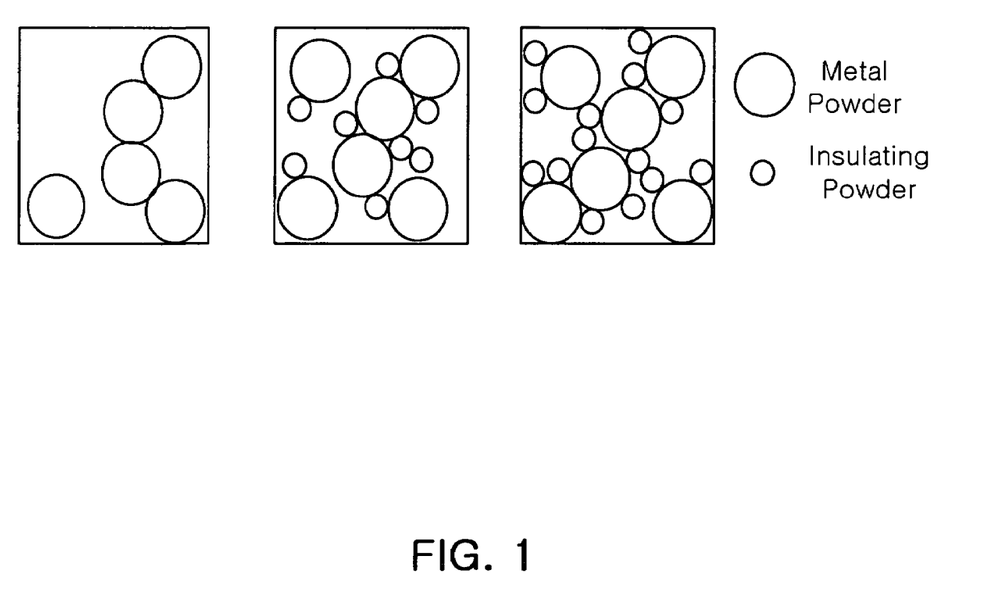
FIG. 1 schematically shows the states of metal particles and ceramic particles mixed and dispersed in a polymer resin.
Figure 2A:
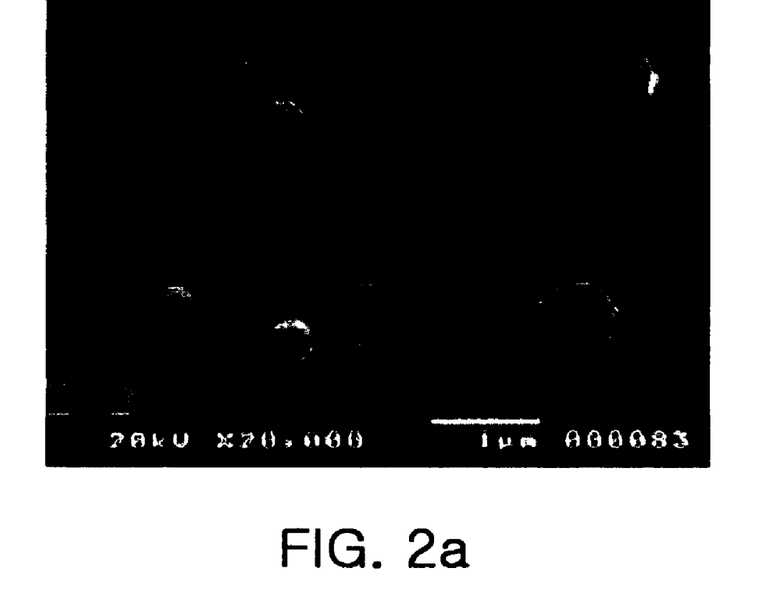
FIGS. 2a and 2b are photographs showing spherical metal particles and metal particles whose surface is roughly treated, respectively.
Figure 2B:
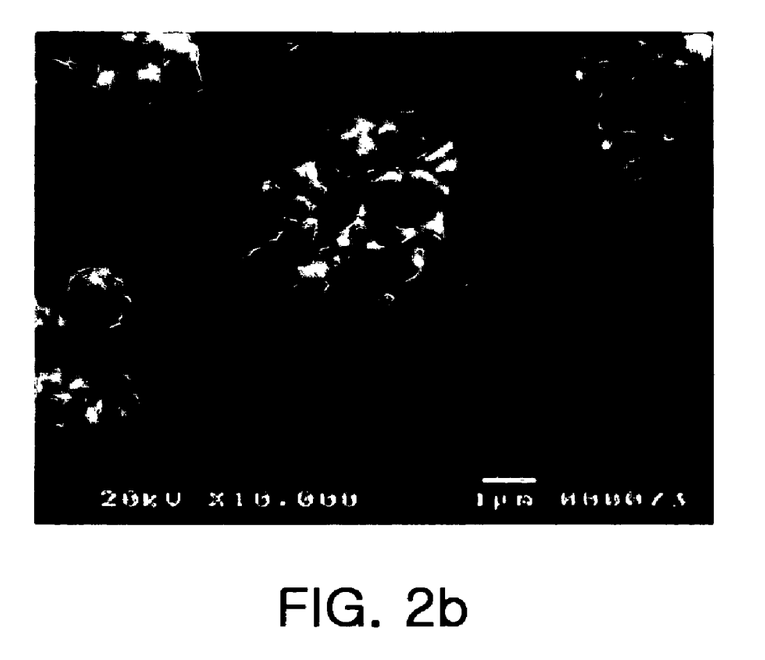

After the metal particles and the ceramic particles are added to the resin, the mixture is dispersed in the resin. The mixing and dispersion of the metal particles and the ceramic particles can be carried out by ball milling, but are not limited to this process. FIG. 1 schematically shows the states of the metal particles and the ceramic particles mixed and dispersed in the resin.

By taking advantage of the fact that the metal particles have a relatively high ductility than the ceramic particles, the ceramic particles are bound to the surface of the metal particles. That is, during ball milling of the mixture of the metal particles and the ceramic particles, the ceramic particles having a relatively low ductility are bound to the surface of the metal particles having a relatively high ductility. As shown in FIG. 1, since the ceramic insulating particles surround the surface of the metal particles, the ceramic insulating particles play a role in forming a ceramic coating layer on the surface of the metal particles. In doing so, the occurrence of percolation arising from the contact between the metal particles is inhibited. Since the metal particles are not completely coated with the ceramic insulating particles, a portion of the surface of the metal particles is exposed. The exposed portion functions as an electrode, thus serving to increase the capacitance.

If the amount of the ceramic insulating particles mixed with the metal particles is increased, the metal particles may be added in a larger amount. In addition, since the ceramic insulating particles in a powder form irregularly surround around the metal particles, the percolation potential width is large, thus achieving high dielectric constant.

Furthermore, the metal/ceramic/polymer composite dielectric material of the present invention may further comprise a curing agent, a curing accelerator, a dispersant and/or a defoaming agent. The kind and amount of these additives can be properly selected by those skilled in the art.

Examples of suitable curing agents include any commonly known curing agents, for example, phenolic curing agents, such as bisphenol A novolac resins; amine-type curing agents, such as dicyandiamide, dicyanguanidine, diaminodiphenyl methane and diaminodiphenyl sulfone; and acid anhydride curing agents, such as trimellitic anhydride and benzophenone tetracarboxylic acid. These curing agents may be used alone or in combination. Suitable curing accelerators include any generally known curing accelerators, such as 2-methylimidazole.

The resin used in the present invention is not specially limited, but examples thereof include any resin commonly used in the art to which the present invention pertains, such as polymethylmethacrylate (PMMA), epoxy resins, bisphenol A type epoxy resins, novolac type epoxy resins, and polyfunctional epoxy resins.

The present invention also provides a capacitor with improved dielectric properties, such as high dielectric constant and low dielectric loss, using a composite dielectric material, which is characterized in that ceramic particles are bound to the surface of metal particles having a relatively high ductility in a resin.

The present invention also provides a multilayer printed circuit board in which capacitors produced using the composition are formed in a circuit.

The present invention also provides a module substrate comprising capacitors produced using the composition embedded therein and semiconductor chips mounted thereon.

EXAMPLES

Hereinafter, the present invention will be explained in detail with reference to the following examples. The following examples serve to illustrate preferred embodiments of the present invention but are not meant to restrict the scope of the invention.

Examples 1-2

PMMA, $BaTiO_3$ (BTO) ceramic particles (average particle diameter: 0.82 μm) as filler particles and Ni particles (average particle diameter: 4 μm) whose surface was roughly treated were mixed together in accordance with the compositions (vol %) indicated in Table 1. At this time, the BTO content was fixed to 10% by volume and the Ni content was increased. Changes in dielectric properties with increasing Ni content were measured.

Each of the mixtures was treated using a ball mill for 2 hours, and cured using a mounting press under a pressure of 270 bar at 180° C. for 30 minutes. A copper foil was cut into pieces having a predetermined size, attached to both surfaces of the cured sample, and pressed under a pressure of 300 bar to manufacture a final sample.

The dielectric properties of the sample were measured. Specifically, the dielectric constant and dielectric tangent of the sample were measured using an impedance analyzer at 1 MHz. The obtained values are listed in Table 1.

Examples 3-5

PMMA, BTO ceramic particles (average particle diameter: 0.82 μm) as filler particles and Ni particles (average particle diameter: 4 μm) whose surface was roughly treated were mixed together in accordance with the compositions (vol %) indicated in Table 1. At this time, the BTO content was fixed to 20% by volume and the Ni content was increased. Thereafter, the procedure of Example 1 was repeated.

The obtained results are shown in Table 1.

Comparative Examples 1-2

The procedure of Example 1 was repeated, except that PMMA and BTO ceramic particles (average particle diameter: 0.82 μm) were mixed together in accordance with the compositions (vol %) indicated in Table 1.

The obtained results are shown in Table 1.

Comparative Examples 3-4

The procedure of Example 1 was repeated, except that PMMA and BTO ceramic particles (average particle diameter: 1.0 μm) were mixed together in accordance with the compositions (vol %) indicated in Table 1.

The obtained results are shown in Table 1.

Comparative Examples 5-6

The procedure of Example 1 was repeated, except that PMMA and Ni particles (average particle diameter: 4 μm)

whose surface was roughly treated were mixed together in accordance with the compositions (vol %) indicated in Table 1.

The obtained results are shown in Table 1.

Comparative Examples 7-8

The procedure of Example 1 was repeated, except that PMMA and spherical Ni particles (average particle diameter: 4 μm) were mixed together in accordance with the compositions (vol %) indicated in Table 1.

The obtained results are shown in Table 1.

Comparative Examples 9-10

The procedure of Example 1 was repeated, except that PMMA and Cu particles were mixed together in accordance with the compositions (vol %) indicated in Table 1.

The obtained results are shown in Table 1.

TABLE 1

| Example No. | PMMA | BTO (0.82 μm) | BTO (1.0 μm) | Rough Ni (4 μm) | Spherical Ni (4 μm) | Cu | Dielectric constant (k) | Dielectric loss (df) |
|---|---|---|---|---|---|---|---|---|
| Ex. 1 | 85 | 10 | | 5 | | | 9.31 | 0.016 |
| Ex. 2 | 80.5 | 10 | | 9.5 | | | 62.7 | 2.29 |
| Ex. 3 | 75 | 20 | | 5 | | | 13.3 | 0.017 |
| Ex. 4 | 70 | 20 | | 10 | | | 27 | 0.053 |
| Ex. 5 | 65 | 20 | | 15 | | | 119 | 0.58 |
| Comp. Ex. 1 | 90 | 10 | | | | | 6.05 | 0.019 |
| Comp. Ex. 2 | 80 | 20 | | | | | 7.87 | 0.014 |
| Comp. Ex. 3 | 90 | | 10 | | | | 6.38 | 0.016 |
| Comp. Ex. 4 | 80 | | 20 | | | | 11.5 | 0.013 |
| Comp. Ex. 5 | 96 | | | 4 | | | 4.61 | 0.02 |
| Comp. Ex. 6 | 95 | | | 5 | | | 28 | 32 |
| Comp. Ex. 7 | 95 | | | | 5 | | 4.05 | 0.02 |
| Comp. Ex. 8 | 85 | | | | 15 | | 10.71 | 10 |
| Comp. Ex. 9 | 95 | | | | | 5 | 5.13 | 0.56 |
| Comp. Ex. 10 | 93 | | | | | 7 | 17.7 | 21 |

The contents of each component are expressed as vol %.

The data of Table 1 show changes in the dielectric constant and dielectric loss of the samples according to the changes in the contents of the respective components. Specifically, the samples of Examples 1-5 exhibited higher rate of increment in dielectric constant and lower rate of increment in dielectric loss than the samples of Comparative Examples 1-10.

Figure 3:
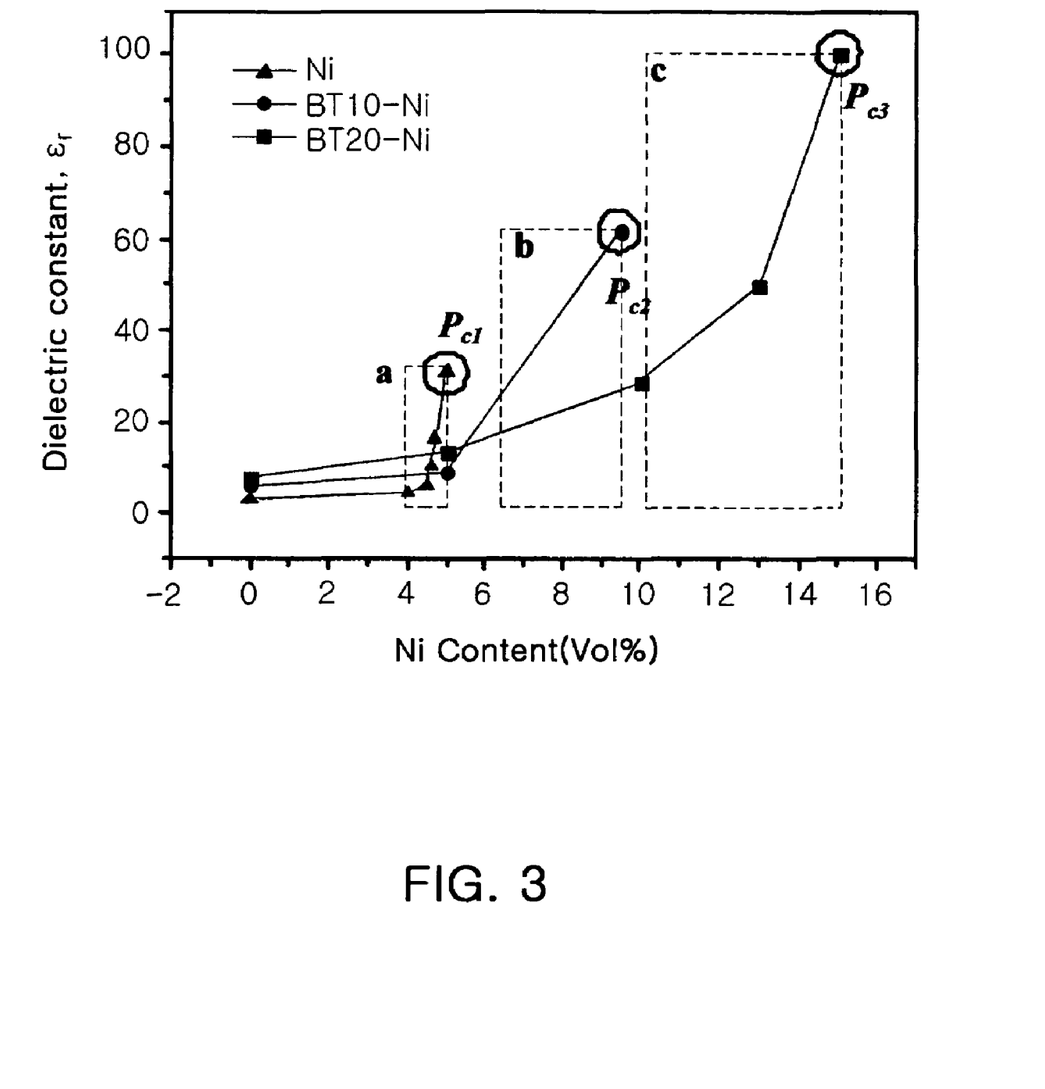
FIG. 3 is a graph showing the correlation between the percolation critical fractions, percolation transition areas and dielectric constant values according to the changes in the contents of respective components in samples produced in Examples 1-5 and Comparative Examples 1 and 2.

The percolation critical fraction Pc (Pc1) and percolation transition area (a) of the samples of Comparative Examples 1 and 2 containing no metal and having different BTO contents were compared to those (Pc2 and b, respectively) of the samples of Examples 1 and 2 having the fixed BTO content (10 vol %) and different Ni contents, and those (Pc3 and c, respectively) of the samples of Examples 3-5 having the fixed BTO content (20 vol %) and different Ni contents. The results are shown in FIG. 3. Further, changes in dielectric constant and dielectric loss according to the changes in frequency were plotted (FIGS. 4a and 4b).

The graph shown in FIG. 3 represents that as the amount of BTO added increases, the percolation critical fraction of Ni increases (Pc1<Pc2<Pc3), the percolation transition area increases (a>b>c), and the dielectric constant values are very high.

Figure 4A:
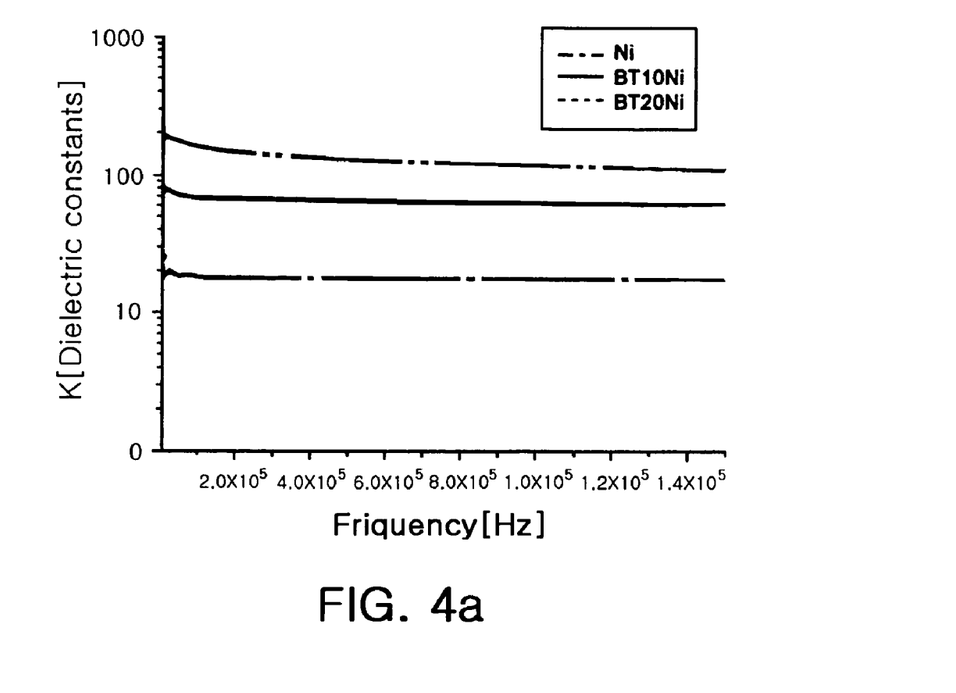
FIGS. 4a and 4b are graphs showing changes in dielectric properties versus frequency according to the changes in the contents of respective components in samples produced in Examples 1-5 and Comparative Examples 1 and 2.
Figure 4B:
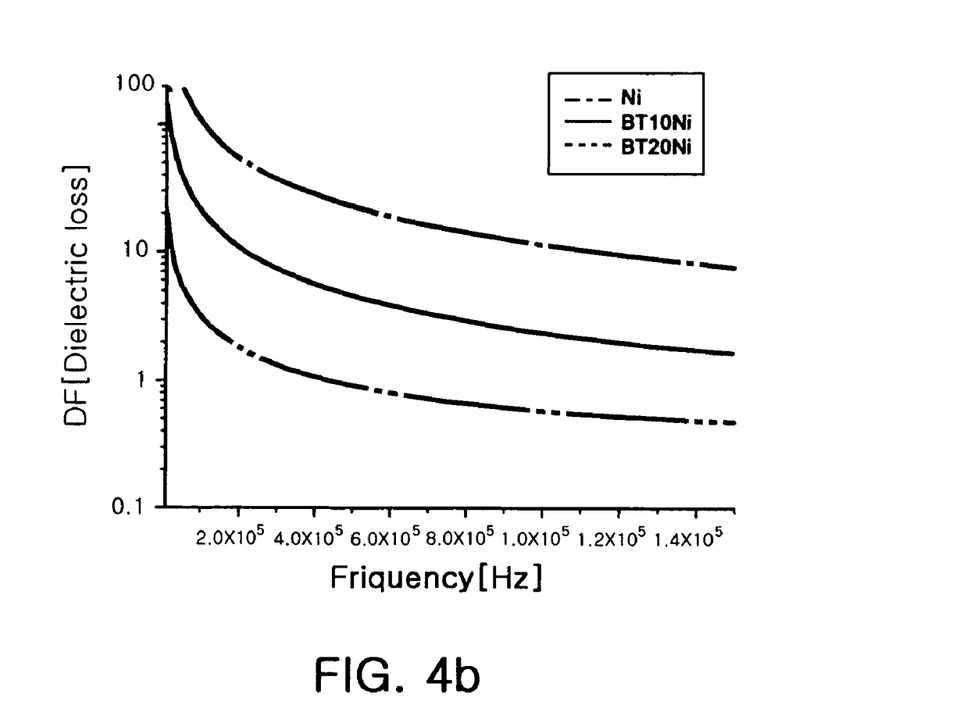

The graphs shown in FIGS. 4a and 4b demonstrate that the composite dielectric materials of the present invention have dielectric properties (i.e. higher dielectric constant and lower dielectric loss) superior to those of the conventional composite dielectric materials containing Ni alone.

As apparent from the above description, according to the composite dielectric material of the present invention, since ceramic particles having a relatively small size are bound to the surface of metal particles having a relatively large size by mixing, the occurrence of percolation can be prevented without coating the metal particles, and at the same time, the capacitance of an embedded capacitor can be increased. In addition, a process for coating the surface of the metal particles can be omitted, thus contributing to the simplification of the overall preparation procedure. Furthermore, since the ceramic particles having a relatively small diameter are bound to the surface of the metal particles having a relatively large diameter, they act as insulators. Therefore, the composite dielectric material of the present invention has advantageous effects, e.g., high dielectric constant and low dielectric loss.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A composite dielectric material comprising a resin, metal particles and ceramic particles wherein the metal particles have an average diameter of 0.1-7.5 μm and the ceramic particles have an average diameter of below 50% of that of the metal particles, and wherein the ceramic particles are bound to the surface of the metal particles.

2. The composite dielectric material according to claim 1, wherein the metal particles have a rough surface and a surface roughness of 0.01 to 0.5 microns.

3. The composite dielectric material according to claim 1, wherein the metal is selected from the group consisting of Cu, Ni, Ag, Al, Zn, Co, Fe, Cr, Mn, and mixtures thereof.

4. The composite dielectric material according to claim 1, wherein the ceramic particles are particles of at least one ferroelectric material selected from the group consisting of $BaTiO_3$, $PbTiO_3$, $CaTiO_3$, $SrTiO_3$, PMN, PMN-PT, PZT, PZN-PT and PMT-PT.

5. The composite dielectric material according to claim 1, wherein the ceramic particles are present in an amount of 1-40% by volume.

6. A capacitor using the composite dielectric material according to any one of claims 1 to 5.

7. A multilayer printed circuit board in which the capacitor according to claim 6 is formed in a circuit.

8. A module substrate comprising the capacitor according to claim 6 embedded therein and a semiconductor chip mounted thereon.

9. A composite dielectric material comprising a resin, metal particles in an amount of 1-30% by volume and ceramic particles, wherein the ceramic particles are bound to the surface of the metal particles.

10. A composite dielectric material comprising a resin, metal particles and ceramic particles, wherein the ceramic particles are bound to the surface of the metal particles, and wherein the ceramic particles are doped with an additive selected from oxides (2+, 3+ and 5+) of Mn, Mg, Sr, Ca, Y and Nb, oxides of lanthanide elements Ce, Dy, Ho, Yb and Nd, and mixtures thereof.

11. A method for preparing a composite dielectric material by mixing 1-30% by volume of metal particles and 1-40% by volume of ceramic particles in 30-98% by volume of a resin, and ball milling the mixture to bind the ceramic particles having a relatively low ductility to the metal particles have a relatively high ductility.

12. The method according to claim 11, wherein the resin is selected from polymethylmethacrylate (PMMA), epoxy resins, bisphenol A type epoxy resins, novolac type epoxy resins, polyfunctional epoxy resins, and combinations thereof.

13. The method according to claim 11, wherein the metal is selected from the group consisting of Cu, Ni, Ag, Al, Zn, Co, Fe, Cr, Mn, and mixtures thereof.

14. The method according to claim 11, wherein the ceramic particles are particles of at least one ferroelectric material selected from the group consisting of $BaTiO_3$, $PbTiO_3$, $CaTiO_3$, $SrTiO_3$, PMN, PMN-PT, PZT, PZN-PT, and PMT-PT.

15. The method according to claim 11, wherein the metal particles have an average diameter of 0.1-7.5 μm and the ceramic particles have an average diameter below 50% of that of the metal particles.

16. Composite dielectric material comprising 1-30% by volume of metal particles and 1-40% by volume of ceramic particles in 30-98% by volume of a resin, wherein the ceramic particles are bound to the surface of the metal particles.

17. The composite dielectric material according to claim 16, wherein the metal particles have a rough surface and a surface roughness of 0.01 to 0.5 microns.

18. The composite dielectric material according to claim 16, wherein the metal is selected from the group consisting of Cu, Ni, Ag, Al, Zn, Co, Fe, Cr, Mn, and mixtures thereof.

19. The composite dielectric material according to claim 16, wherein the metal particles are present in an amount of 1-30% by volume.

20. The composite dielectric material according to claim 16, wherein the ceramic particles are particles of at least one ferroelectric material selected from the group consisting of $BaTiO_3$, $PbTiO_3$, $CaTiO_3$, $SrTiO_3$, PMN, PMN-PT, PZT, PZN-PT and PMT-PT.

21. The composite dielectric material according to claim 16, wherein the ceramic particles are doped with an additive selected from oxides (2+, 3+, and 5+) of Mn, Mg, Sr, Ca, Y and Nb, oxides of lanthanide elements Ce, Dy, Ho, Yb and Nd, and mixtures thereof.

22. The composite dielectric material according to claim 16, wherein the ceramic particles are present in an amount of 1-40% by volume.

23. The composite dielectric material according to claim 16, wherein the metal particles have an average diameter of 0.1-7.5 μm and the ceramic particles have an average diameter below 50% of that of the metal particles.

24. A capacitor using the composite dielectric material according to claim 16.

25. A multilayer printed circuit board in which the capacitor according to claim 24 is formed in a circuit.

26. A module substrate comprising the capacitor according to claim 24 embedded therein and a semiconductor chip mounted thereon.

* * * * *